United States Patent
Kim et al.

(10) Patent No.: US 8,623,692 B2
(45) Date of Patent: Jan. 7, 2014

(54) METHOD FOR MANUFACTURING SOLAR CELL INCLUDING ETCHING

(75) Inventors: Myung Su Kim, Yongin-si (KR); Min Chul Song, Yongin-si (KR); Soon Young Park, Yongin-si (KR); Dong Seop Kim, Yongin-si (KR); Sung Chan Park, Yongin-si (KR); Yoon Mook Kang, Yongin-si (KR); Tae Jun Kim, Yongin-si (KR); Min Ki Shin, Yongin-si (KR); Sang Won Lee, Yongin-si (KR); Heung Kyoon Lim, Yongin-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 13/276,044

(22) Filed: Oct. 18, 2011

(65) Prior Publication Data

US 2012/0149144 A1    Jun. 14, 2012

(30) Foreign Application Priority Data

Dec. 9, 2010 (KR) .......................... 10-2010-0125560

(51) Int. Cl.
*H01L 21/00* (2006.01)

(52) U.S. Cl.
USPC ............... 438/71; 438/48; 438/96; 438/97; 438/98; 257/E21.02; 257/E21.09; 257/E31.02; 257/E31.12; 257/E31.119; 257/E31.124

(58) Field of Classification Search
USPC ............... 438/71, 48, 96–98; 257/E21.09, 257/E31.02, E31.09, E31.12, E31.119, 257/E31.124
See application file for complete search history.

(56) References Cited

U.S. PATENT DOCUMENTS

| | | | | |
|---|---|---|---|---|
| 5,296,388 A | * | 3/1994 | Kameyama et al. | 438/370 |
| 5,500,102 A | * | 3/1996 | Ichikawa et al. | 204/192.25 |
| 5,989,969 A | * | 11/1999 | Watanabe et al. | 438/381 |
| 6,091,019 A | * | 7/2000 | Sakata et al. | 136/256 |
| 6,225,644 B1 | * | 5/2001 | Yamaguchi et al. | 257/59 |
| 6,242,331 B1 | * | 6/2001 | Chu et al. | 438/586 |
| 6,326,279 B1 | * | 12/2001 | Kakizaki et al. | 438/406 |
| 6,410,436 B2 | * | 6/2002 | Yamagata et al. | 438/689 |
| 6,605,518 B1 | * | 8/2003 | Ohmi et al. | 438/458 |
| 6,653,209 B1 | * | 11/2003 | Yamagata | 438/459 |
| 6,720,237 B2 | * | 4/2004 | Iwasaki et al. | 438/458 |
| 7,297,639 B2 | * | 11/2007 | Rana | 438/756 |
| 7,316,961 B2 | * | 1/2008 | Won et al. | 438/381 |
| 7,449,417 B2 | * | 11/2008 | Kim et al. | 438/753 |
| 8,012,531 B2 | * | 9/2011 | Kim et al. | 427/75 |
| 8,053,343 B2 | * | 11/2011 | Huh et al. | 438/542 |

(Continued)

OTHER PUBLICATIONS

Roder et al., "0.4% Absolute Efficiency Gain of Industrial Solar Cells Doped Selective Emitter", IEEE 2009, pp. 000871-000873.

*Primary Examiner* — Lex Malsawma
*Assistant Examiner* — Eric Jones
(74) *Attorney, Agent, or Firm* — Lee & Morse, P.C.

(57) ABSTRACT

A method for manufacturing a solar cell is presented. The method includes: forming an amorphous silicon layer on a first surface of a light absorbing layer; doping the amorphous silicon layer with a dopant; forming a dopant layer by diffusing the dopant into the amorphous silicon layer with a laser; forming a semiconductor layer by removing the dopant that remains outside the dopant layer; etching the surface of the semiconductor layer by using an etchant; forming a first electrode on the semiconductor layer; and forming a second electrode on a second surface of the light absorbing layer.

19 Claims, 8 Drawing Sheets

(56) References Cited

U.S. PATENT DOCUMENTS

| | | | |
|---|---|---|---|
| 8,075,792 B1* | 12/2011 | Branz et al. | 216/89 |
| 8,088,675 B2* | 1/2012 | Rana et al. | 438/482 |
| 8,216,911 B2* | 7/2012 | Rana | 438/381 |
| 2002/0132455 A1* | 9/2002 | Muramatsu et al. | 438/486 |
| 2002/0134754 A1* | 9/2002 | Kim | 216/39 |
| 2003/0181014 A1* | 9/2003 | Ohta et al. | 438/294 |
| 2005/0237538 A1* | 10/2005 | Belleville | 356/504 |
| 2006/0105521 A1* | 5/2006 | Won et al. | 438/253 |
| 2007/0049041 A1* | 3/2007 | Rana | 438/736 |
| 2007/0158775 A1* | 7/2007 | Cunningham et al. | 257/467 |
| 2007/0163618 A1* | 7/2007 | Kim et al. | 134/1.3 |
| 2008/0258212 A1* | 10/2008 | Pattanayak et al. | 257/330 |
| 2009/0017606 A1* | 1/2009 | Fath et al. | 438/558 |
| 2009/0039274 A1* | 2/2009 | Ushiki et al. | 250/370.06 |
| 2009/0093776 A1* | 4/2009 | Yue et al. | 604/272 |
| 2009/0183768 A1* | 7/2009 | Wenham et al. | 136/256 |
| 2009/0227047 A1* | 9/2009 | Yang et al. | 438/8 |
| 2009/0311821 A1* | 12/2009 | Dimitrov et al. | 438/71 |
| 2010/0022074 A1* | 1/2010 | Wang et al. | 438/479 |
| 2010/0048006 A1* | 2/2010 | Huang et al. | 438/542 |
| 2010/0055915 A1* | 3/2010 | Kanegae et al. | 438/704 |
| 2010/0120248 A1* | 5/2010 | Fath et al. | 438/692 |
| 2010/0147379 A1* | 6/2010 | Kishimoto | 136/258 |
| 2010/0229925 A1* | 9/2010 | Kim et al. | 136/252 |
| 2010/0237434 A1* | 9/2010 | Van Noort et al. | 257/379 |
| 2010/0240172 A1* | 9/2010 | Rana et al. | 438/96 |
| 2011/0143484 A1* | 6/2011 | Lin et al. | 438/72 |
| 2011/0240997 A1* | 10/2011 | Rockenberger et al. | 257/49 |
| 2011/0244626 A1* | 10/2011 | Huang et al. | 438/98 |
| 2011/0265864 A1* | 11/2011 | Kim et al. | 136/252 |
| 2012/0125424 A1* | 5/2012 | Wenham et al. | 136/256 |
| 2012/0132270 A1* | 5/2012 | Wenham et al. | 136/256 |

* cited by examiner

METHOD FOR MANUFACTURING SOLAR CELL INCLUDING ETCHING

CROSS-REFERENCE TO RELATED APPLICATION

This application claims priority to and the benefit of Korean Patent Application No. 10-2010-0125560 filed in the Korean Intellectual Property Office on Dec. 9, 2010, the entire content of which is incorporated herein by reference.

BACKGROUND OF THE INVENTION (a) Field of the Invention

The present invention relates to a method for manufacturing a solar cell.

(b) Description of the Related Art

Solar cells convert sunlight into electrical energy. Solar cells are diodes including a PN bond, and are classified into different types according to the materials that are used in a light absorbing layer.

Solar cells using a silicon layer as a light absorbing layer are classified into a crystalline wafer type solar cell and a thin film type (crystalline and amorphous) solar cell.

In the case of crystalline wafer type solar cell, the bonding characteristic of the P layer and the N layer is excellent such that output current and fill factor are satisfactory. In manufacturing the crystalline wafer type solar cell, after the PN bonding, the dopant is diffused by using a laser in a preselected region of the surface of the semiconductor in order to increase the dopant concentration in the region. The laser-induced diffusing of the dopant makes the doping layer thin and prevents recombination of an electron and a hole.

However, the laser-induced diffusing of the dopant damages the surface of the semiconductor.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a method for manufacturing a solar cell having advantages of improving the contact characteristic of an electrode and the efficiency of the solar cell by removing the surface damage of a semiconductor.

An exemplary embodiment of the present invention provides a method for manufacturing a solar cell, including: forming an amorphous silicon layer on a first surface of a light absorbing layer; doping the amorphous silicon layer with a dopant; forming a dopant layer by diffusing the dopant into the amorphous silicon layer with a laser; forming a semiconductor layer by removing the dopant that remains outside the dopant layer; etching the surface of the semiconductor layer by using an etchant; forming a first electrode on the semiconductor layer; and forming a second electrode on a second surface of the light absorbing layer.

The etching of the surface of the semiconductor layer by using the etchant may include soaking the surface of the semiconductor layer in the etchant for 1 to 3 minutes.

The etching of the surface of the semiconductor layer by using the etchant may include etching the surface of the semiconductor layer by 20 to 30 nm.

The etchant may include a hydrogen fluoride aqueous solution, a nitric acid aqueous solution, and water or acetic acid and a volume ratio of the hydrogen fluoride aqueous solution, the nitric acid aqueous solution, and water or acetic acid may be in the range of 0.01 to 20:250 to 350:50 to 150.

The hydrogen fluoride aqueous solution includes hydrogen fluoride of 49 wt % and the nitric acid aqueous solution may include nitric acid of 70 wt %.

The etchant may include a sodium hydroxide aqueous solution and the sodium hydroxide aqueous solution may include sodium hydroxide of 45 wt %.

The etchant may include a hydrogen fluoride aqueous solution, hydrogen peroxide, and water and a volume ratio of the hydrogen fluoride aqueous solution, hydrogen peroxide, and water may be in the range of 0.1 to 2.0:5 to 20:80 to 120.

The dopant doping layer is aligned with the first electrode.

The dopant doping layer may have a thickness of 300 to 1500 nm.

The light absorbing layer may be made of crystalline silicon.

The surface of the light absorbing layer may be textured.

The dopant may be an N-type dopant.

According to exemplary embodiments of the present invention, the surface damage of the semiconductor layer is removed by using the etchant, thereby improving the contact characteristic of an electrode.

DETAILED DESCRIPTION OF THE EMBODIMENTS

Figure 1:
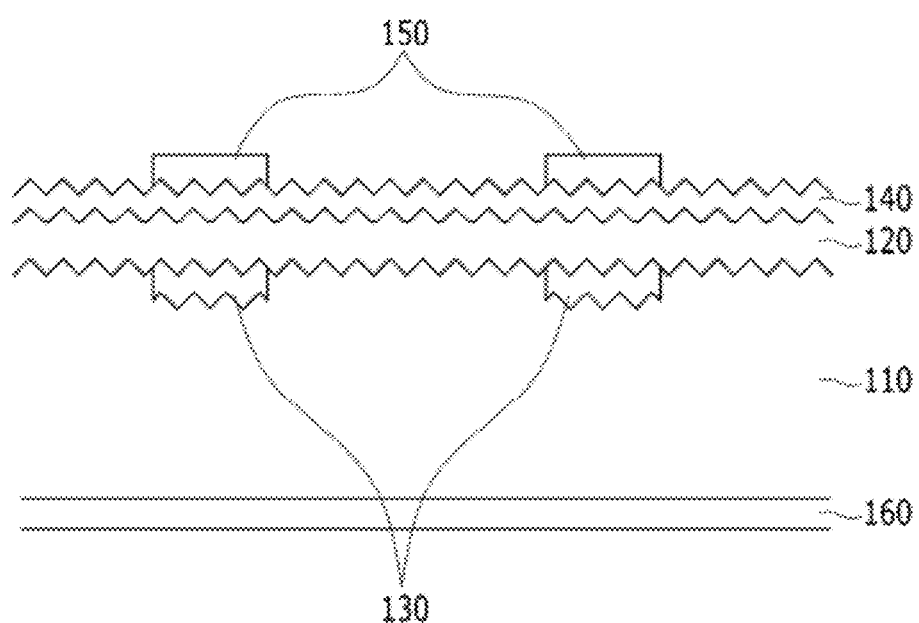
FIG. 1 is a cross-sectional view of a solar cell according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a cross-sectional view of a solar cell according to an exemplary embodiment of the present invention.

As shown in FIG. 1, the solar cell according to the exemplary embodiment of the present invention includes a light absorbing layer 110, a semiconductor layer 120, an anti-reflection coating 140, and a first electrode 150 sequentially disposed on a first surface of the light absorbing layer 110, and a second electrode 160 disposed on a second surface of the light absorbing layer 110. In addition, the light absorbing layer 110 includes a dopant layer 130 disposed at some portions of the light absorbing layer's interface with the semiconductor layer 120. As shown, the dopant layer 130 extends into the light absorbing layer from the interface.

The light absorbing layer 110 is formed by a crystalline silicon substrate and acts as a P-type semiconductor actually absorbing light. In order to reduce the reflection of incident light, the surface of the light absorbing layer 110 is textured. The semiconductor layer 120 is formed by doping the semiconductor (e.g., amorphous silicon) with an N-type dopant such as phosphor (P).

Absorbed sunlight generates current by operation of the PN junction formed by the light absorbing layer 110 and the semiconductor layer 120.

The dopant layer 130 is disposed at a portion of the interface between the light absorbing layer 110 and the semiconductor layer 120. The dopant layer 130 is doped with an N-type impurity, and the dopant layer 130 is substantially aligned with the first electrode 150 is positioned. The dopant layer 130 has a thickness of 300 to 1500 nm.

The anti-reflection coating 140 is made of silicon nitride (SiNx) and reduces reflection of incident light.

The first electrode 150 and the second electrode 160 may be made of a low-resistance metal such as silver (Ag) and laid out in a grid pattern, such that a shadowing loss and a surface resistance may be decreased.

In addition, a buffer layer (not shown) preventing the recombination of the electron with a hole may be disposed between the light absorbing layer 110 and the second electrode 160.

Hereinafter, a method for manufacturing a solar cell according to an exemplary embodiment of the present invention will be described in detail with reference to FIGS. 2 to 6 and FIG. 1.

FIGS. 2 to 6 are diagrams sequentially showing a method for manufacturing a solar cell according to an exemplary embodiment of the present invention.

Figure 2:
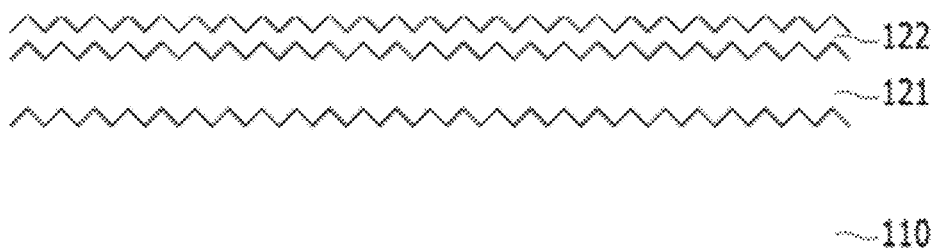
FIGS. 2 to 6 are diagrams sequentially showing a method for manufacturing a solar cell according to an exemplary embodiment of the present invention.

As shown in FIG. 2, an amorphous silicon layer 121 is formed on a first surface of a light absorbing layer 110 and an N-type dopant layer 122 including a dopant such as phosphor (P) is formed on the surface of the amorphous silicon layer 121. The light absorbing layer 110 is formed by a crystalline silicon substrate and has a thickness of 180 to 220 μm. The amorphous silicon layer 121 has a thickness of 200 to 800 nm. In addition, the surface of the light absorbing layer 110 is textured in order to reduce the reflection of light.

Figure 3:
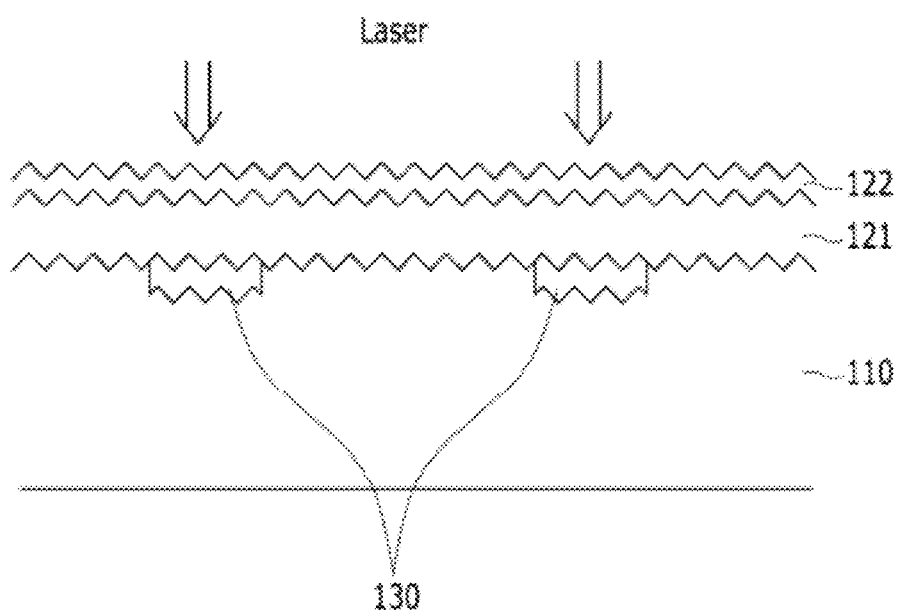

Thereafter, as shown in FIG. 3, the N-type dopant layer 122 is irradiated with a laser beam, inducing a diffusing process of the dopant.

At this time, the dopant layer 130 is formed on the light absorbing layer 110 in the portion of the light absorbing layer 110 that corresponds to the region that was irradiated with laser. The dopant layer 130 has a thickness of 300 to 1500 nm.

Figure 4:
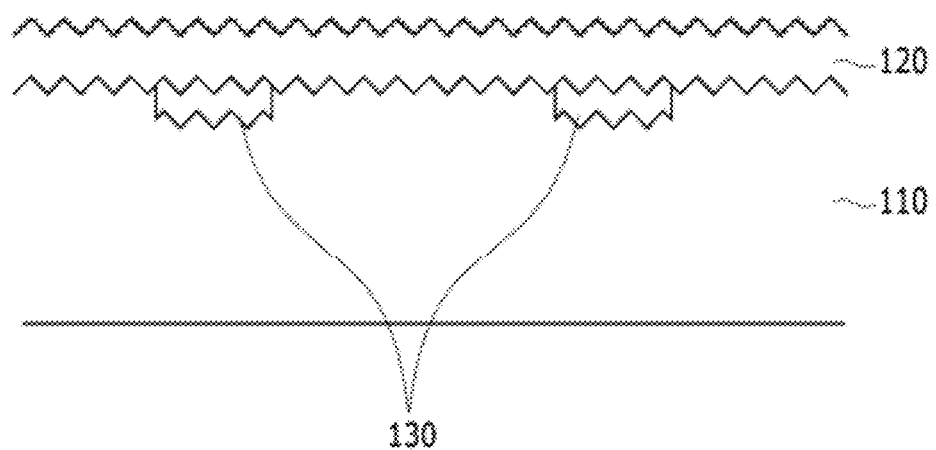

Thereafter, as shown in FIG. 4, the semiconductor layer 120 is formed by removing the N-type dopant layer 122 that did not diffuse into the semiconductor layer. During this removal process, the surface of the semiconductor layer 120 that does not interface the light absorbing layer 110 may be damaged. Due to this damage to the surface, contact characteristic with the first electrode 150, which is to be formed on the damaged surface, is deteriorated.

Figure 5:
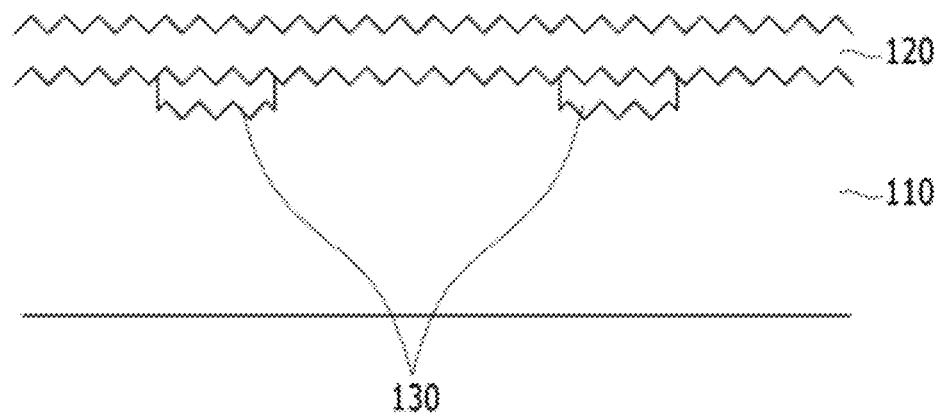

Thereafter, as shown in FIG. 5, the damaged surface of the semiconductor layer 120 is removed by using an etchant.

The etchant according to a first exemplary embodiment of the present invention includes a mixture of a hydrogen fluoride (HF) aqueous solution, a nitric acid ($HNO_3$) aqueous solution, and water or acetic acid. The hydrogen fluoride (HF) aqueous solution includes hydrogen fluoride of 49 wt % and the nitric acid ($HNO_3$) aqueous solution includes nitric acid of 70 wt %. In the etchant according to the first exemplary embodiment of the present invention, the hydrogen fluoride (HF) aqueous solution, the nitric acid ($HNO_3$) aqueous solution, and water or acetic acid are mixed at a volume ratio of 0.01 to 20:250 to 350:50 to 150.

Further, an etchant according to a second exemplary embodiment of the present invention may include a sodium hydroxide (KOH) aqueous solution. The sodium hydroxide (KOH) aqueous solution includes sodium hydroxide of 45 wt %.

Further, an etchant according to a third exemplary embodiment of the present invention may include a mixture of a hydrogen fluoride (HF) aqueous solution, hydrogen peroxide ($H_2O_2$), and water. The hydrogen fluoride aqueous solution includes hydrogen fluoride of 49 wt %. In the etchant according to the third exemplary embodiment of the present invention, the hydrogen fluoride (HF) aqueous solution, hydrogen peroxide, and water are mixed at a volume ratio of 0.1 to 2.0:5 to 20:80 to 120.

When the crystalline silicon substrate formed the semiconductor layer 120 is soaked in one of the above etchants for 1 to 3 minutes, the surface of the semiconductor layer 120 is etched by 20 to 30 nm. Accordingly, the damaged surface of the semiconductor layer 120 is removed.

Alternatively, the damaged surface of the semiconductor layer 120 may be removed by using a plasma method or a reactive ion etching (RIE) method without using the etchant.

Figure 6:
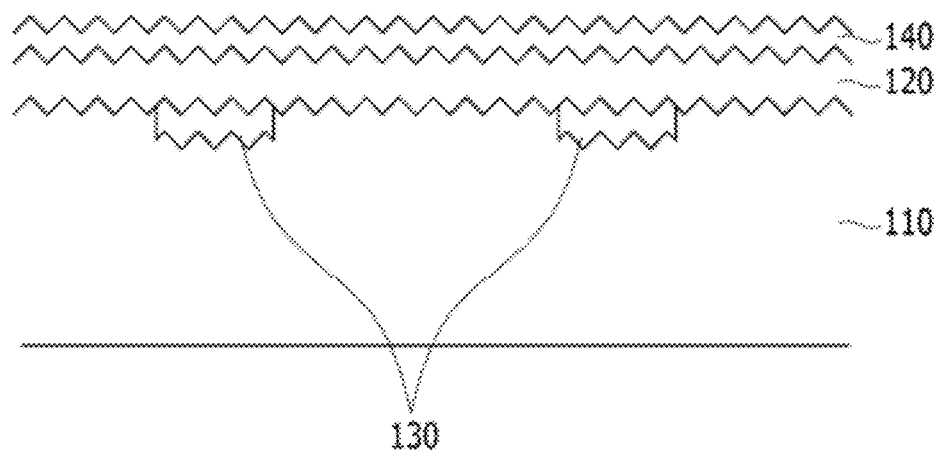

Thereafter, as shown in FIG. 6, after an anti-reflection coating 140 is formed on the semiconductor layer 120 with silicon nitride, as shown in FIG. 1, a first electrode 150 is formed on the anti-reflection coating 140 and a second electrode 160 is formed on the second surface of the light absorbing layer 110. The first electrode 150 and the second electrode 160 may be made of a low-resistance metal such as silver (Ag) and laid out to form a grid pattern, such that a shadowing loss and a surface resistance may be decreased.

In addition, a buffer layer (not shown) preventing the recombination of electrons with holes may be disposed between the light absorbing layer 110 and the second electrode 160.

The surface damage of the semiconductor layer is reduced by using an etchant, such that the contact characteristic of the first electrode may be improved.

Figure 7A:
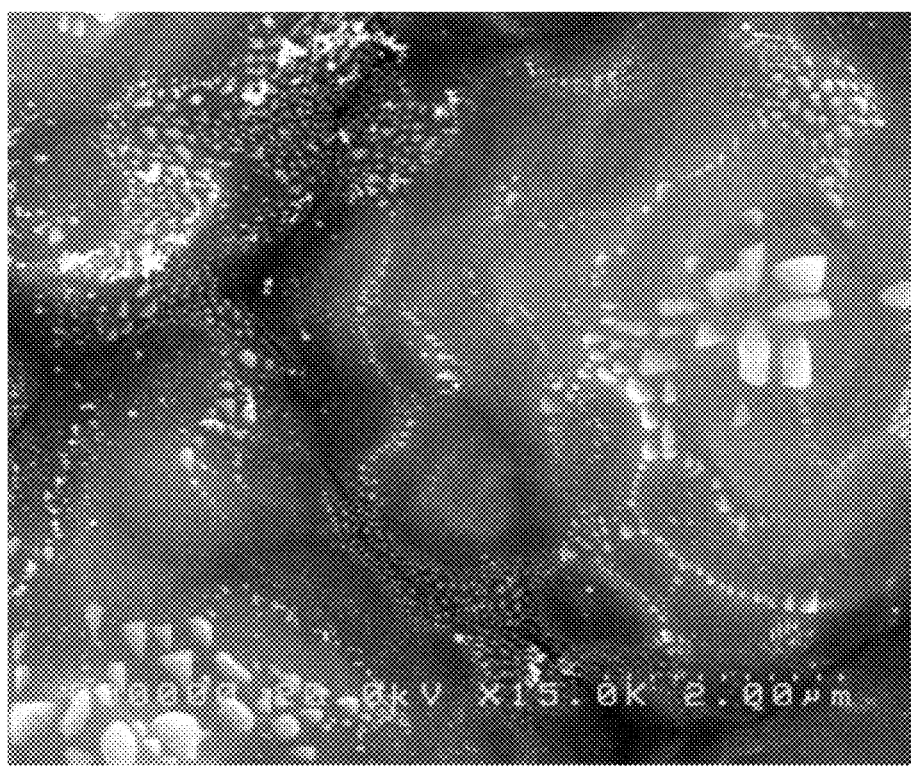
FIG. 7A is a SEM picture for crystal density of silver in the case where a surface damage of a semiconductor layer is not removed.

Hereinafter, the improvement in a contact characteristic of an electrode will be described with reference to FIGS. 7A and 7B. FIG. 7A is a SEM picture for crystal density of silver without removal of the damaged semiconductor surface, and FIG. 7B is a SEM picture for crystal density of silver after the damaged surface of a semiconductor layer is removed by using an etchant according to a first exemplary embodiment of the present invention.

Figure 7B:
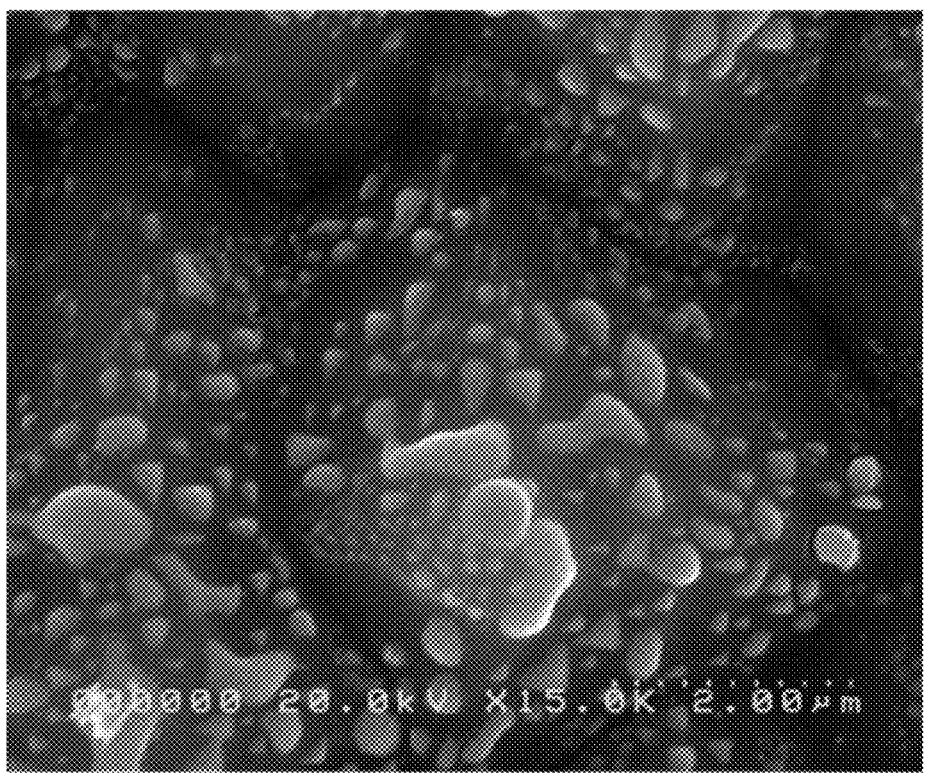
FIG. 7B is a SEM picture for crystal density of silver in the case where a surface damage of a semiconductor layer is removed by using an etchant according to a first exemplary embodiment of the present invention.

As shown in FIGS. 7A and 7B, in the case where the surface damage of the semiconductor layer is removed, much more and larger silver crystals are formed as compared with the case where the surface damage of the semiconductor layer is not removed. This indicates that the contact characteristic of the electrode made of silver is further improved in the case where the surface damage of the semiconductor layer is removed, as compared with the case where the surface damage of the semiconductor layer is not removed.

While this invention has been described in connection with what is presently considered to be practical exemplary embodiments, it is to be understood that the invention is not limited to the disclosed embodiments, but, on the contrary, is <Description of symbols>

| | |
|---|---|
| 110: Light absorbing layer | 120: Semiconductor layer |
| 130: Dopant layer | 150: First electrode |
| 160: Second electrode | |

What is claimed is:

1. A method for manufacturing a solar cell, comprising:
  forming an amorphous silicon layer on a first surface of a light absorbing layer, the light absorbing layer being made of crystalline silicon;
  forming a dopant on the amorphous silicon layer;
  forming a dopant layer by diffusing the dopant into the amorphous silicon layer with a laser;
  removing the dopant that remains on the amorphous silicon layer outside the dopant layer;
  etching to remove a portion of a surface of the amorphous silicon layer by using an etchant, a remaining portion of the amorphous silicon layer corresponding to a semiconductor layer;
  forming a first electrode on the semiconductor layer; and
  forming a second electrode on a second surface of the light absorbing layer.

2. The method of claim 1, wherein etching to remove the portion of the surface of the amorphous silicon layer includes soaking the surface of the amorphous silicon layer in the etchant for 1 to 3 minutes.

3. The method of claim 2, wherein etching to remove the portion of the surface of the amorphous silicon layer includes etching the surface of the amorphous silicon layer by 20 to 30 nm.

4. The method of claim 1, wherein:
  the etchant includes:
  a hydrogen fluoride aqueous solution,
  a nitric acid aqueous solution, and
  water or acetic acid; and
  a volume ratio of the hydrogen fluoride aqueous solution, the nitric acid aqueous solution, and the water or acetic acid is in a range of 0.01 to 20:250 to 350:50 to 150.

5. The method of claim 4, wherein the hydrogen fluoride aqueous solution includes hydrogen fluoride at 49 wt % and the nitric acid aqueous solution includes nitric acid at 70 wt %.

6. The method of claim 1, wherein the etchant includes a sodium hydroxide aqueous solution and the sodium hydroxide aqueous solution includes sodium hydroxide at 45 wt %.

7. The method of claim 1, wherein:
  the etchant includes:
  a hydrogen fluoride aqueous solution,
  hydrogen peroxide, and
  water; and
  a volume ratio of the hydrogen fluoride aqueous solution, the hydrogen peroxide, and the water is in a range of 0.1 to 2.0:5 to 20:80 to 120.

8. The method of claim 1, wherein the dopant layer is aligned with the first electrode.

9. The method of claim 8, wherein the dopant layer has a thickness of 300 to 1500 nm.

10. The method of claim 1, wherein the first surface of the light absorbing layer is textured.

11. The method of claim 1, wherein the dopant is an N-type dopant.

12. The method of claim 1, wherein forming the dopant layer includes diffusing the dopant into the light absorbing layer.

13. The method of claim 12, further comprising forming a top dopant layer on the amorphous silicon layer, wherein:
  forming the dopant layer includes irradiating the laser on the top dopant layer, and
  removing the dopant that remains on the amorphous silicon layer outside the dopant layer includes removing the top dopant layer.

14. The method of claim 13, wherein:
  removing the top dopant layer includes completely removing the top dopant layer, and
  the amorphous silicon layer is etched after the top dopant layer is completely removed.

15. A method for manufacturing a solar cell, comprising:
  forming a silicon layer on a first surface of a light absorbing layer, the light absorbing layer including crystalline silicon, and the silicon layer including amorphous silicon;
  forming a top dopant layer on the silicon layer, the top dopant layer including a dopant;
  forming a dopant layer by diffusing the dopant into the light absorbing layer with a laser;
  removing the top dopant layer to expose the silicon layer;
  etching to remove a portion of the exposed silicon layer, the removed portion of the exposed silicon layer including a portion that was changed during removing the top dopant layer;
  forming a first electrode on the etched silicon layer; and
  forming a second electrode on a second surface of the light absorbing layer.

16. The method of claim 15, wherein forming the dopant layer includes selectively diffusing the dopant into the light absorbing layer, and the dopant layer is aligned with the first electrode.

17. The method of claim 15, wherein:
  the exposed silicon layer is etched with an etchant;
  the etchant includes:
  a hydrogen fluoride aqueous solution,
  a nitric acid aqueous solution, and
  water or acetic acid; and
  a volume ratio of the hydrogen fluoride aqueous solution, the nitric acid aqueous solution, and the water or acetic acid is in a range of 0.01 to 20:250 to 350:50 to 150.

18. The method of claim 15, wherein:
  the exposed silicon layer is etched with an etchant;
  the etchant includes:
  a hydrogen fluoride aqueous solution,
  hydrogen peroxide, and
  water; and
  a volume ratio of the hydrogen fluoride aqueous solution, the hydrogen peroxide, and the water is in a range of 0.1 to 2.0:5 to 20:80 to 120.

19. The method of claim 15, wherein:
  removing the top dopant layer to expose the silicon layer includes completely removing the top dopant layer, and
  etching to remove a portion of the exposed silicon layer is after the top dopant layer is completely removed.

* * * * *